US008963590B2

(12) United States Patent
Guimont et al.

(10) Patent No.: US 8,963,590 B2
(45) Date of Patent: Feb. 24, 2015

(54) POWER CYCLING POWER ON RESET CIRCUIT FOR FUSE INITIALIZATION CIRCUITRY

(75) Inventors: Joe G. Guimont, Plymouth, MN (US); David K. Nelson, Medicine Lake, MN (US); Walter W. Heikkila, Burnsville, MN (US); Anuj Kohli, Apple Valley, MN (US)

(73) Assignee: Honeywell International Inc., Morristown, NJ (US)

( * ) Notice: Subject to any disclaimer, the term of this patent is extended or adjusted under 35 U.S.C. 154(b) by 1040 days.

(21) Appl. No.: 12/424,446

(22) Filed: Apr. 15, 2009

(65) Prior Publication Data
US 2009/0206891 A1 Aug. 20, 2009

Related U.S. Application Data

(63) Continuation-in-part of application No. 11/762,317, filed on Jun. 13, 2007, now abandoned.

(51) Int. Cl.
*H03L 7/00* (2006.01)
*H03K 3/02* (2006.01)
*H03K 17/04* (2006.01)
*H03K 17/22* (2006.01)

(52) U.S. Cl.
CPC .................................. *H03K 17/223* (2013.01)
USPC ............ 327/143; 327/142; 327/198; 327/377

(58) Field of Classification Search
USPC .................. 327/142, 143, 198, 377
See application file for complete search history.

(56) References Cited

U.S. PATENT DOCUMENTS

| 3,895,239 | A | 7/1975 | Alaspa |
| 4,837,520 | A | 6/1989 | Golke et al. |
| 4,900,950 | A | 2/1990 | Dubujet |
| 5,463,336 | A | 10/1995 | Gupta et al. |
| 5,517,144 | A | 5/1996 | Nakashima |
| 5,528,184 | A | 6/1996 | Gola et al. |
| 5,804,996 | A | 9/1998 | Verhaeghe et al. |
| 5,881,014 | A | 3/1999 | Ooishi |
| 6,124,733 | A | 9/2000 | Sharpe-Geisler |

(Continued)

OTHER PUBLICATIONS

Office Action dated Dec. 24, 2008 from U.S. Appl. No. 11/762,317, 11 pages.

(Continued)

*Primary Examiner* — Lincoln Donovan
*Assistant Examiner* — Colleen O Toole
(74) *Attorney, Agent, or Firm* — Shumaker & Sieffert, P.A.

(57) ABSTRACT

A system for initializing circuitry is presented. The system employs a power-on reset circuit having a threshold voltage and a programmable switch circuit. The power-on reset circuit has a detector circuit for detecting a reference voltage, and a one-sided latch for generating an output voltage reflective of the reference voltage. The detector circuit has a threshold after which the one-sided latch is activated. The programmable switch circuit receives the output voltage of the power-on reset circuit and generates an enable signal and its complement based on the status of an internal fuse. The switch point of the power-on reset circuit provides for a rapid increase in output voltage that offsets parasitic leakage current in the programmable switch circuit that can result in improper enable signal output. A high resistance direct path to ground on an output node of the power-on reset circuit prevents residual charge from causing an undesired misfire.

32 Claims, 9 Drawing Sheets

(56) References Cited

U.S. PATENT DOCUMENTS

| | | |
|---|---|---|
| 6,144,237 A | 11/2000 | Ikezaki |
| 6,175,261 B1 | 1/2001 | Sundararaman et al. |
| 6,211,710 B1 | 4/2001 | Madhu et al. |
| 6,566,937 B1 | 5/2003 | Mori et al. |
| 6,650,155 B1 | 11/2003 | Nguyen et al. |
| 6,952,122 B2 | 10/2005 | Moyal |
| 7,030,668 B1 | 4/2006 | Edwards |
| 7,057,427 B2 | 6/2006 | Wadhwa et al. |
| 7,098,722 B2 | 8/2006 | Shih et al. |
| 7,149,136 B2 | 12/2006 | Tanishima et al. |
| 7,196,561 B2 * | 3/2007 | Bhattacharya et al. ....... 327/143 |
| 7,276,889 B2 | 10/2007 | Gan et al. |
| 7,310,008 B1 | 12/2007 | Masleid |
| 7,425,854 B2 | 9/2008 | Suzuki |
| 2003/0117198 A1 * | 6/2003 | Honda et al. ................ 327/198 |
| 2006/0091920 A1 | 5/2006 | Youssef |
| 2007/0001721 A1 | 1/2007 | Chen et al. |
| 2007/0103210 A1 | 5/2007 | Hsu |
| 2008/0309384 A1 | 12/2008 | Guimont et al. |

OTHER PUBLICATIONS

Responsive Amendment dated Mar. 24, 2009 for U.S. Appl. No. 11/762,317, 7 pages.
Office Action dated Jun. 15, 2009 from U.S. Appl. No. 11/762,317, 12 pages.
Responsive Amendment dated Aug. 17, 2009 for U.S. Appl. No. 11/762,317, 17 pages.
Request for Continued Examination and Amendment dated Sep. 15, 2009 for U.S. Appl. No. 11/762,317, 19 pages.
Office Action dated Sep. 29, 2009 from U.S. Appl. No. 11/762,317 13 pages.
Office Action from U.S. Appl. No. 11/762,317, dated Apr. 5, 2010, 25 pp.

* cited by examiner

POWER CYCLING POWER ON RESET CIRCUIT FOR FUSE INITIALIZATION CIRCUITRY

CROSS-REFERENCE TO RELATED APPLICATIONS

This application is a continuation-in-part of and claims priority to U.S. patent application Ser. No. 11/762,317, filed Jun. 13, 2007, the entire contents of which are incorporated herein by reference.

FIELD OF THE INVENTION

The invention relates to redundancy initialization circuitry, and more particularly, to redundancy initialization circuitry having improved response characteristics in the case of fast-cycling power supply conditions.

BACKGROUND

In the manufacture of large-area integrated circuit systems, it is relatively common for defects to occur in a small percentage of the elements that make up the integrated circuit system. In order to increase yields during the manufacture of the integrated circuit systems, redundant circuitry may be added that can be used to selectively replace defective primary circuit elements with secondary "backup" circuit elements. For example, in memory systems which may contain highly symmetric and repetitive device layouts, additional individual device elements, columns of elements, or rows of elements may be included in the circuit layout. These additional elements may be selectively activated through redundancy switches during the manufacturing process. Specifically, if during circuit testing a primary element is determined to be defective, a corresponding redundancy switch can be programmed to enable redundant circuitry to replace the functionality of the defective element. This type of testing is sometimes referred to as wafer sort, wafer sort test, wafer final test, electronic die sort and circuit probe.

Several types of redundancy switch elements are programmed via the selective blowing of integrated fuses located within the redundancy switch circuitry. These integrated fuses are ideally binary elements which act as resistive elements in their initial (default) state, and act as open circuits when blown. In practice, however, blown fuses may exhibit a certain amount of leakage current. In many cases, this leakage current may manifest in relatively benign consequences, such as slight increases in power consumption by the redundancy switch. However, depending on the switch circuitry configurations, this leakage current also may result in the failure of the redundancy switch to function properly. This problem has become more prevalent as device dimensions have shrunk, resulting in increased leakage currents.

FIG. 1 shows a conventional switch control circuit 100 that is programmed through the use of two integrated fuses 106 and 108. The switch control circuit 100 takes as input the reference voltages VDD 120 and VSS (ground) 122, and outputs an enable signal 102 and its complement 104. In its default state, fuses 106 and 108 are not blown, and act as resistive elements. As a result, internal node N1 114 is resistively coupled to VSS 122 and internal node N2 110 is resistively coupled to VDD 120. When reference voltage VDD 120 is powered up, N2 110 rises to the voltage level of VDD. Because N2 110 is coupled to the gate input of p-type transistor MP2 112, as the voltage level of VDD rises, N2 110 maintains MP2 112 in the "off" position. Additionally, although N1 114 is capacitively coupled to VDD through the gate capacitance of p-type transistor MP1 118, the resistive coupling of node N1 114 to VSS 122 through fuse F1 108 is sufficient to maintain N1 114 at VSS. N-type transistor MN1 116 is also maintained in the "off" position while N1 114 is maintained at VSS.

In the programmed position, the integrated fuses 106 and 108 are blown and ideally act as open circuits. In this configuration, node N1 114 is no longer resistively coupled to VSS 122 and the capacitive coupling with VDD 120 through MP1 118 eventually pulls N1 114 up to VDD. This rise in voltage of N1 114 is sufficient to turn on transistor MN1 116 and set node N2 110 to VSS. With N2 110 tied to VSS 122, transistor MP2 112 is turned on, thereby reinforcing the voltage of N1 114 at VDD. With N1 114 set to VDD, the output enable signal 102 is set to VDD and its complement 104 is set to VSS.

However, as noted above, fuses do not act as ideal open circuits when blown and instead may present a source of leakage current. Thus, when switch control circuit 100 is in the programmed position and fuses 106 and 108 are blown, node N1 114 is not entirely de-coupled from node VSS 122 and leakage current may flow from N1 114 through fuse 108 to reference voltage VSS 122. Moreover, if blown fuse 108 provides too much leakage current, node N1 114 may not be pulled up to VDD through the capacitive coupling of MP1 118. In this case, N1 114 is maintained at VSS and the output signals 102 and 104 are placed in the incorrect state. This condition is more pronounced when the power-on ramp rate of VDD is slower, since leakage current through blown fuse 108 is provided a greater opportunity to drain charge provided to N1 114 through capacitive coupling to VDD.

Thus, there exists the possibility that existing switch control circuits may operate incorrectly in certain situations, especially when blown fuses provide relatively large amounts of leakage current or when power-on ramp rates of reference voltages are relatively slow. Therefore, it would be beneficial to have a system or circuit that was more resistant to the conditions presented by these situations.

SUMMARY

A system for initializing redundant circuitry is presented. The system includes a power-on reset circuit comprising a voltage switch, and a single fuse redundancy switch circuit, which together provide improved resistance against parasitic leakage currents. A modified power-on reset circuit is also provided having improved response characteristics in the case of fast-cycling power supply conditions.

In one example, the system comprises a power-on reset circuit having a detector circuit that receives a first reference voltage signal VDD, and outputs a detection signal, where the detection signal indicates that VDD has reached a threshold voltage; and a latch circuit that receives the detection signal and outputs a power-on reset signal. The system further comprises a switch circuit connected to a first reference voltage signal VDD and a second reference voltage signal VSS, the switch circuit comprising a fuse and receiving the power-on reset signal and outputting an enable signal, where the enable signal evaluates to VDD when the fuse is blown and to VSS when the fuse is not blown. Additionally, the system may output a complement of the enable signal. Generally, the detection signal indicates that VDD has reached the threshold voltage by rising to substantially the voltage of VDD, and the power-on reset signal is VSS prior to the threshold voltage being reached, and is VDD after the detection signal indicates that VDD has reached the threshold voltage.

In another example, the switch circuit may comprise a PMOS transistor that selectively couples VDD to an internal node and that is operated by the power-on reset signal, an NMOS transistor that selectively couples the fuse to the internal node and that is operated by the power-on reset signal, another NMOS transistor that selectively couples an output node to VSS and that is operated by the internal node, another PMOS transistor that selectively couples the internal node to VDD and that is operated by the output node, and an inverter that receives the output node and outputs the enable signal. The latch may additionally comprise another second inverter that receives the enable signal and outputs an enable complement signal. Further, the switch circuit further comprises two PMOS transistors connected in series so as to selectively couple VDD to the output node, and which are operated by the internal node. Alternatively, a single transistor operated by the internal node may be used to selectively couple VDD to the output node. Additionally, the switch circuit may comprise other components, such as a capacitor connected between VDD and the internal node, a second capacitor connected between VSS and the output node, and a diode-connected PMOS transistor connected between VDD and the internal node.

In yet another example, the detector circuit may comprise a voltage divider circuit that outputs a voltage divider signal, where the voltage divider signal varies proportionately with the voltage differential between VDD and VSS, and a trigger circuit that receives the voltage divider signal and outputs the detection signal, where the detection signal indicates that VDD has reached the threshold voltage when the voltage divider signal exceeds a trigger voltage. The trigger circuit may comprise a hysteresis device, such as a Schmitt trigger, having a forward trigger voltage that receives the voltage divider signal and outputs a trigger signal, where the trigger signal indicates if the voltage divider signal exceeds the forward trigger voltage, and an inverter that receives the trigger signal and outputs the detection signal. The voltage divider circuit may comprise a first resistor and a second resistor connected in series. Further, the detector circuit may comprise a first PMOS transistor that selectively couples VDD to the voltage divider circuit, and the latch may generate a feedback signal such that the first PMOS transistor receives the feedback signal and decouples VDD from the voltage divide circuit when the feedback signal approaches VDD.

In yet another example, the latch may comprise a NOR device that outputs a NOR output signal, a first inverter that receives the NOR output signal and outputs a feedback signal, and wherein the NOR device receives as input the detection signal and the feedback signal. The latch may further comprise additional components such as a diode-connected PMOS transistor connected between VDD and the NOR output signal, a diode-connected NMOS transistor connected between VSS and the feedback signal, a capacitor connected between the NOR output signal and VDD, and a third capacitor connected between the feedback signal and VSS.

In yet another example, the latch may comprise a NOR device that outputs a NOR output signal, and a high resistance resistor connected between the feedback signal and VSS. The high resistance resistor my have a resistance of greater than 10 kΩ, and is preferably greater than 100 kΩ. The implementation of a direct path to VSS on the feedback signal line greatly improves charge drainage during a power cycling event, and prevents residual charge on the latch output and/or NOR output from causing undesired misfire of the power on reset circuit.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Certain examples are described below in conjunction with the included figures, wherein like reference numerals refer to like elements in the various figures, and wherein.

DETAILED DESCRIPTION

A system and method for initializing circuitry, such as redundant circuitry, is described. The system includes a power-on ramp circuit for measuring the ramp-up of the power reference voltage, and which quickly ramps up an output signal to the level of the power reference voltage once the power reference voltage exceeds a certain threshold. In addition, the system includes a switch circuit, such as may be used to enable redundant circuitry, which can be programmed through the conditioning of a single fuse.

Figure 1:
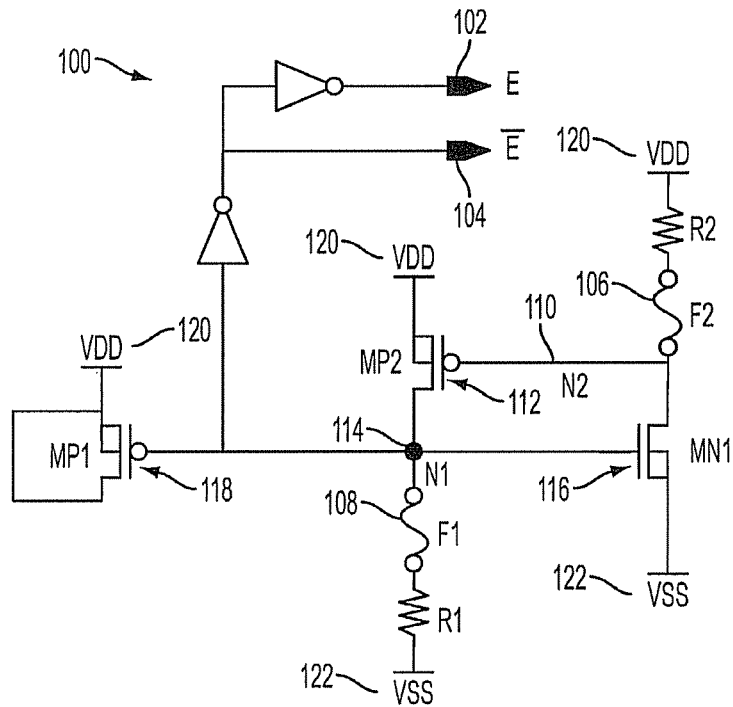
FIG. 1 is an example switch control circuit according to the prior art.
Figure 2:
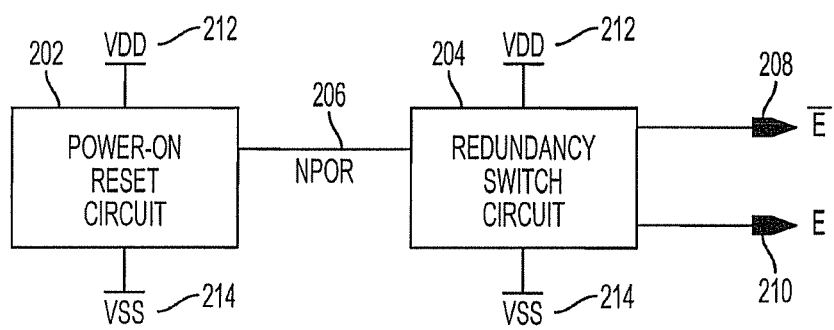
FIG. 2 is an example system for initializing circuitry on power-up according to an embodiment of the invention.

Referring to FIG. 2, the system contains a power-on reset circuit 202 and a control switch circuit 204. The power-on reset circuit 202 is connected to reference voltages VDD 212 and VSS 214, and outputs a power-on reset (NPOR) signal 206 that is based on the voltage level of VDD 212. Initially, the system is turned off and VDD 212 is not powered. Accordingly, the voltage level of VDD remains at an unpowered voltage level and does not exhibit a voltage differential with respect to VSS 214. However, once the system is turned on, the voltage level of VDD rises from its unpowered voltage level to its final reference voltage level. The rise of VDD from its unpowered to its final reference voltage level occurs over a non-zero period of time, which is dependent on the power-on ramp rate of VDD. During the period of time that VDD is ramping up, or the "power-on" period, the power-on reset circuit 202 receives the voltage level of VDD 212 and indicates whether VDD has reached a threshold value. If VDD 212 is below the threshold value, the power-on reset circuit 202 maintains NPOR 206 at a "low" voltage level, which may be substantially at or near the voltage of VSS. Once VDD 212 has reached a threshold value a switching event takes place, in which the power-on circuit 202 responds by quickly raising NPOR 206 from its low voltage level to a "high" voltage level, which may be substantially at or near the voltage level of VDD. After the switching event and while VDD remains powered, power-on circuit 202 maintains signal NPOR 206 at the high voltage level such that it follows VDD. Accordingly, the power-on reset circuit 202 exhibits a "switching" behavior whereby NPOR 206 is initially maintained at a "low" state and then switches to a "high" state when the power supply, VDD, reaches the threshold value.

The control switch circuit 204 is connected to reference voltages VDD 212 and VSS 214, and receives signal NPOR 206 output by the power-on reset circuit 202. Switch circuit 204 outputs an enable signal 210 as well as the complement of the enable signal 208. The switch circuit 204 can be programmed to operate in two different states: a first (inactive or default) state, and a second (active) state. In the inactive state, the switch circuit 204 functions to drive the enable signal 210 low and its complement 208 high. In the active state, the switch circuit 204 functions to drive the enable signal 210 high and its complement 208 low. Given the programmable nature of control switch circuit 204 and corresponding output enable signal 210, the switch circuit 204 can be used to selectively activate or deactivate one or more associated circuits by providing either a high or low output signal. The enable complement signal 208 can further be used to coordinate the selective activation or deactivation of the associated circuits.

For example, control switch circuit 204 can be used to coordinate the activation of a portion of a memory array (such as a row or column in a memory array) and redundant circuitry associated with the portion of the memory array. The portion of the memory array can be controlled through the enable complement signal 208 and the redundant circuitry can be controlled through the enable signal 210. Accordingly, in the inactive state the enable signal 208 is held low and disables the redundant circuitry, while the enable complement signal 210 is driven high and enables the portion of the memory array. If the switch circuit 204 is placed in the active state (for example, due to a determination that the portion of the memory array is non-functional), the enable signal 208 is driven high to enable the redundant circuitry, while the enable complement signal 210 is held low to disable the portion of the memory array.

In one embodiment, the control switch circuit 204 is programmed through the use of a fuse. The fuse is initially maintained in an un-blown (normal or default) state, which corresponds with the inactive state of the control switch circuit 204. The programmable fuse can then be blown, thereby placing the control switch circuit 204 into an active state.

Figure 3:
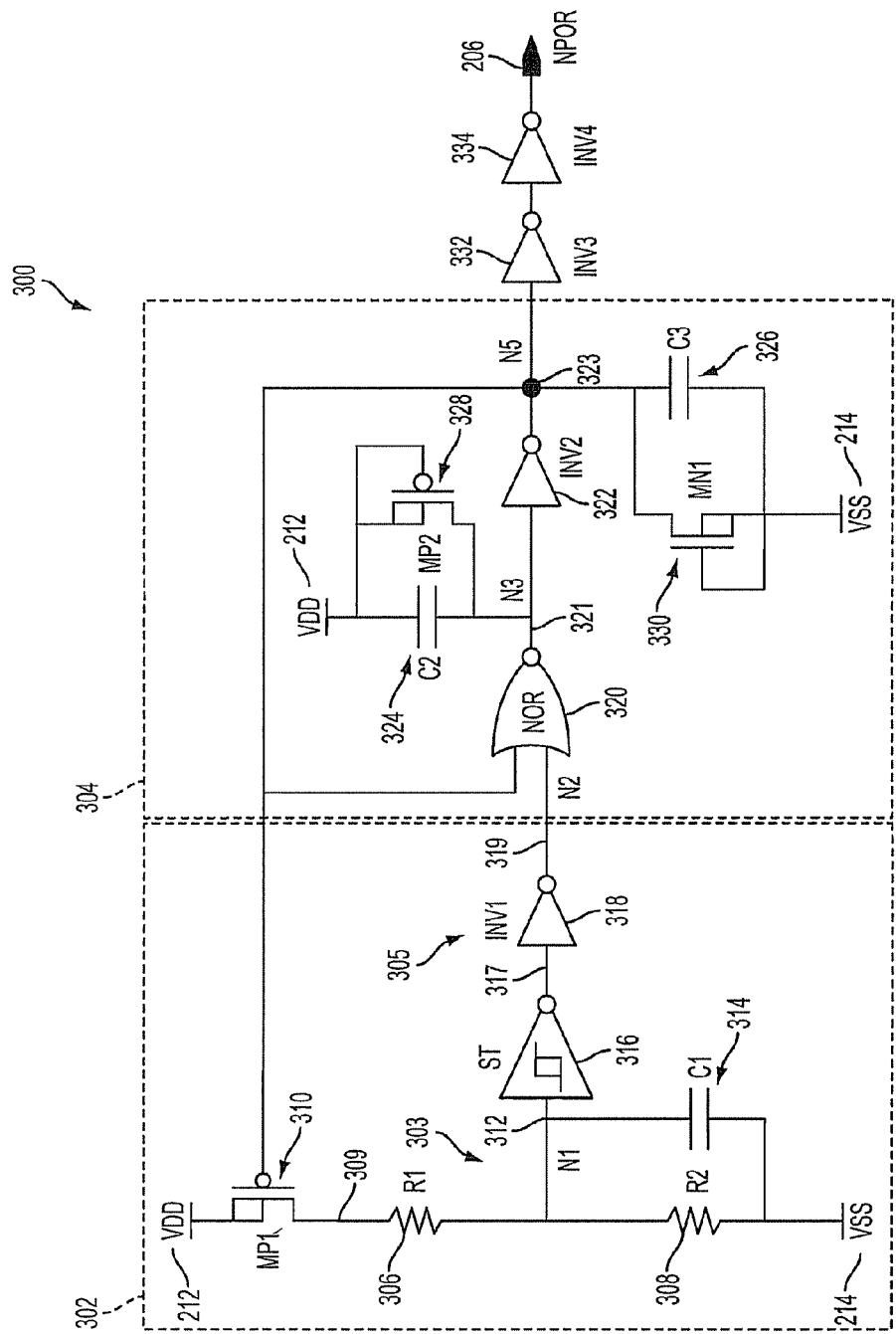
FIG. 3 is a combined schematic and circuit diagram for an example power-on reset circuit according to an embodiment of the invention.

FIG. 3 provides a combined schematic and circuit diagram for a power-on reset circuit 300 according to an embodiment of the invention. The power-on reset circuit 300 generally comprises a detector circuit 302 and a latch 304. The detector circuit 302 receives reference voltage VDD 212, and indicates when VDD 212 has reached a threshold value via output detection signal 319. The detector circuit 302 may function so as to indicate that VDD 212 has reached the threshold value by driving its output, detection signal 319, from a low to a high voltage level at a relatively quick rate.

According to an embodiment, the detector circuit 302 may comprise a voltage divider circuit 303 and a trigger circuit 305. The voltage divider circuit 303 outputs a voltage divider signal 312 whose voltage is a fractional portion of the voltage differential between VDD 212 and VSS 214. Accordingly, the voltage divider signal 312 of the voltage divider circuit 303 varies directly and proportionately with the voltage differential between VDD and VSS. In one embodiment, as shown in FIG. 3, the voltage divider circuit 303 may comprise a first resistor 306 and a second resistor 308 connected in series between VDD 212 and VSS 214, with first resistor 306 having a first terminal selectively coupled to VDD 212, and second resistor 308 having a first terminal coupled to VSS 214. Resistors 306 and 308 may have second terminals commonly connected at node N1, the tap of the voltage divider circuit, which may provide the voltage divider signal 312 output by the voltage divider circuit 303. Selective coupling between first resistor 306 and VDD 212 may be provided by a p-type MOS (PMOS) transistor 310 controlled by a feedback signal 323 from the latch 304, as further described below. It is generally advantageous to have PMOS transistor 310 initially in a weakly-on state, since the high resistance of the device in its weakly-on state ensures that voltage divider signal 312 will not reach a switch point of trigger circuit 305 prematurely.

The voltage divider circuit 303 may further comprise a capacitor 314 connected in parallel with the second resistor 308, and having a first terminal connected to voltage divider signal 312 and a second terminal connected to VSS 214. Capacitor C1 314 may serve as a noise filter to prevent jitter in power supply reference voltage VDD 212 from artificially driving the voltage divider signal 312 above the threshold value of the trigger circuit, as further described below.

The trigger circuit 305 receives the voltage divider signal 312 output by the voltage divider circuit 303 and outputs the detection signal 319. The trigger circuit 312 drives detection signal 319 so as to indicate whether voltage divider signal 312 has reached or exceeds a switch point voltage. In one embodiment, and as shown in FIG. 3, the trigger circuit may comprise a Schmitt trigger 316 and an inverter 318, where the Schmitt trigger 316 receives the voltage divider signal 312 and outputs signal 317, and the inverter 318 receives the Schmitt trigger output 317 and outputs the detection signal 319. Schmitt trigger 316 has a characteristic forward trigger voltage, which represents the switch point of the trigger circuit and which determines the threshold voltage value for VDD. Schmitt trigger 316 reacts to the rise in the input voltage divider signal 312 by maintaining output signal 317 at a high voltage until the voltage divider signal 312 reaches the forward trigger voltage, at which point Schmitt trigger 316 drives output signal 317 low. Schmitt trigger 316 also has a characteristic reverse trigger voltage that is lower than the forward trigger voltage. Once the voltage divider signal 312 has risen above the forward trigger voltage, Schmitt trigger 316 reacts to a fall in the voltage divider 312 by maintaining output signal 317 at a low voltage until the voltage divider signal 312 falls to the reverse trigger voltage, at which point Schmitt trigger 316 drives output signal 317 high. Because of the distinct forward and reverse trigger thresholds, Schmitt trigger 316 exhibits a degree of hysteresis in its operation. This hysteresis helps to ensure proper operation of the detector circuit 302 in response to feedback from the latch 304. Specifically, this hysteresis helps to ensure that the circuit does not latch up to mid-rail when VDD reaches the threshold voltage of the detection circuit 302, which may occur when the transition of the latch circuit 304 is relatively slow, and therefore not decisive.

As noted above, power-on reset circuit 300 further comprises a latch 304 that receives the detection signal 319 from detector circuit 302 and generates a power-on reset signal. Latch 304 is one-sided, such that it will latch a high value in response to the detection signal 312 rising above a threshold value, but will not respond to a drop in the detection signal 312 after that point. Latch 304 resets to a low value upon a reset of the circuit, or when power is no longer supplied to reference voltage VDD 212. In one embodiment, latch 304 comprises a NOR gate 320, and an inverter 322, where inverter 322 receives the output signal 321 of NOR gate 320. NOR gate 320 receives as its input the detection signal 319 and the output of inverter 322. The feedback provided to NOR gate 320 through the input of its inverted output reinforces the one-sided nature of latch 304. The output 323 of inverter 322 may serve as the output NPOR signal of power-on reset circuit 300. Alternatively, latch 304 may further comprise two inverters 332 and 334 connected in series, which may act as buffers. The output of the inverter 334 is representative of the relative voltage level (i.e. low or high) of output node 323, and may also serve as the output NPOR signal of power-on reset circuit 300.

In one embodiment, latch 304 may further comprise capacitors C2 324 and C3 326. Capacitor C2 304 may have a first terminal coupled to VDD 212 and a second terminal coupled to the output node 321 of NOR gate 320, while capacitor C3 326 may have a first terminal coupled to VSS 214 and a second terminal coupled to the output node 323 of inverter 322. Accordingly, capacitors C2 324 and C3 326 may provide capacitive coupling for node 321 to VDD and node 323 to VSS, respectively, during power-up. Further, a diode-connected PMOS transistor 328 may be connected in parallel with capacitor C2 324, having its source and gate connected to VDD 212, and its drain connected to the output node 321 of the NOR gate. Similarly, a diode-connected n-type MOS (NMOS) transistor may be connected in parallel with capacitor C3 326, with its source and gate connected to VSS 214 and its drain connected to the output node 323 of inverter 322. The diode connected transistors 328 and 330 serve to discharge nodes 321 and 323, respectively, during a power-down event.

Additionally, latch 304 may provide feedback to the detection circuit 302 via the output signal 323 of inverter 322. Specifically, output signal 323 may serve as a feedback signal that acts as the gate control input for PMOS transistor 310, thereby controlling the selective coupling of the voltage divider circuit 303 with VDD 212. After the detection signal 319 goes high, output node 321 of NOR gate 320 is forced low and output node 323 of inverter 322 is forced high. When node 323 goes high, PMOS transistor 310 is turned off, thus terminating the DC path to ground created by the voltage divider circuit 303 in the detector circuit 302.

Figure 4:
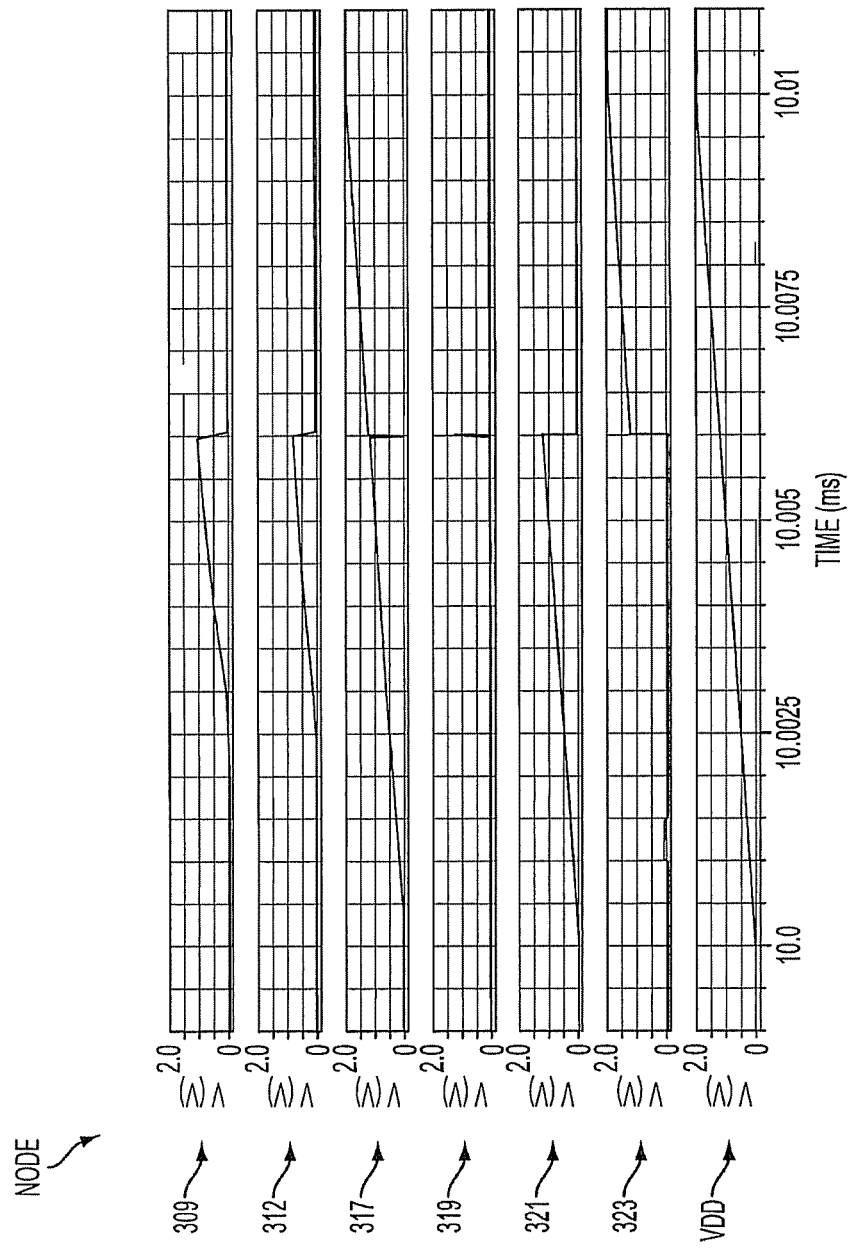
FIG. 4 is a timing diagram explaining an operation of the circuit of FIG. 3.

FIG. 4 sets forth a timing diagram explaining a 50 ms example operation of the circuit of FIG. 3 during VDD ramp up. As shown in FIG. 4, VDD continues to ramp up from VSS (0 V) until it reaches a trigger voltage level of the Schmitt trigger 316 at approximately 60 ms. As shown in FIG. 4, triggering of the Schmitt trigger 316 causes a drop in voltage to VSS at node 317, and a corresponding spike in voltage to approximately VDD at node 319. The rise in voltage of node 319 causes the NOR gate 320 to evaluate to a logic zero, which causes node 321 to drop to VSS. The drop of node 321 to VSS causes the inverter 322 to drive node 323 to substantially VDD. As set forth earlier, the rise of node 323 causes feedback transistor MP1 to turn off, which causes node 309 to fall to VSS, as shown in FIG. 4. The output signal NPOR 206 of the power-on reset circuit 300 follows the level of the node 323 in light of the in-series inverter buffers 332 and 334.

Figure 5:
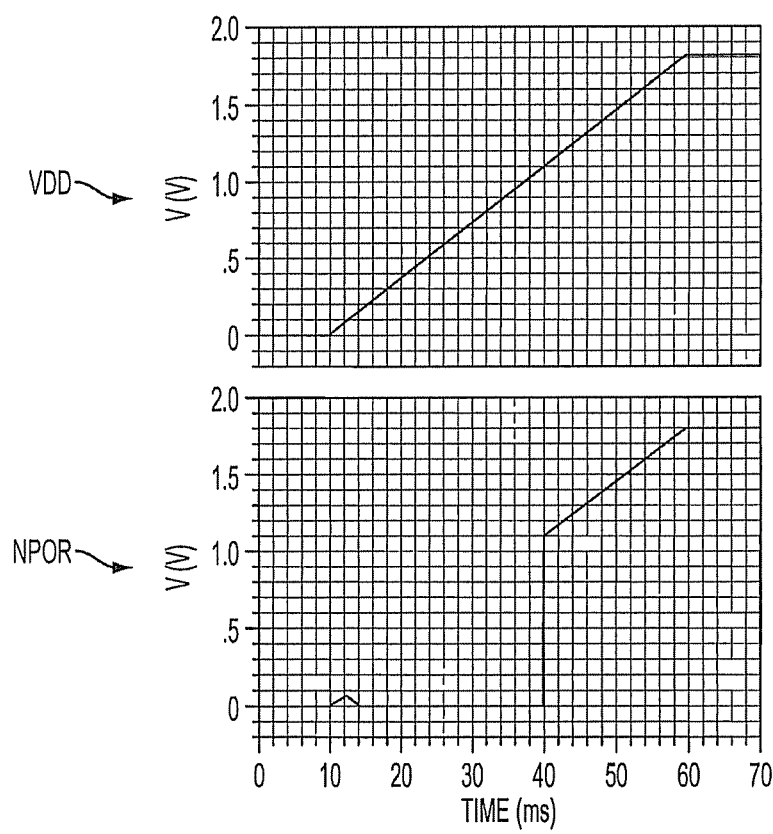
FIG. 5 is a timing diagram comparing the rise in VDD to the POR output of the power on reset circuit.

FIG. 5 discloses a timing diagram setting forth a detailed comparison of the ramp-up of VDD relative to the assertion of the output NPOR 206 in the circuit of FIG. 3. In FIG. 5, the Schmitt trigger 316 is triggered at approximately 40 ms once VDD reaches approximately 1.1 V, causing the NPOR signal to follow VDD at time t=40 ms and thereafter.

Figure 6:
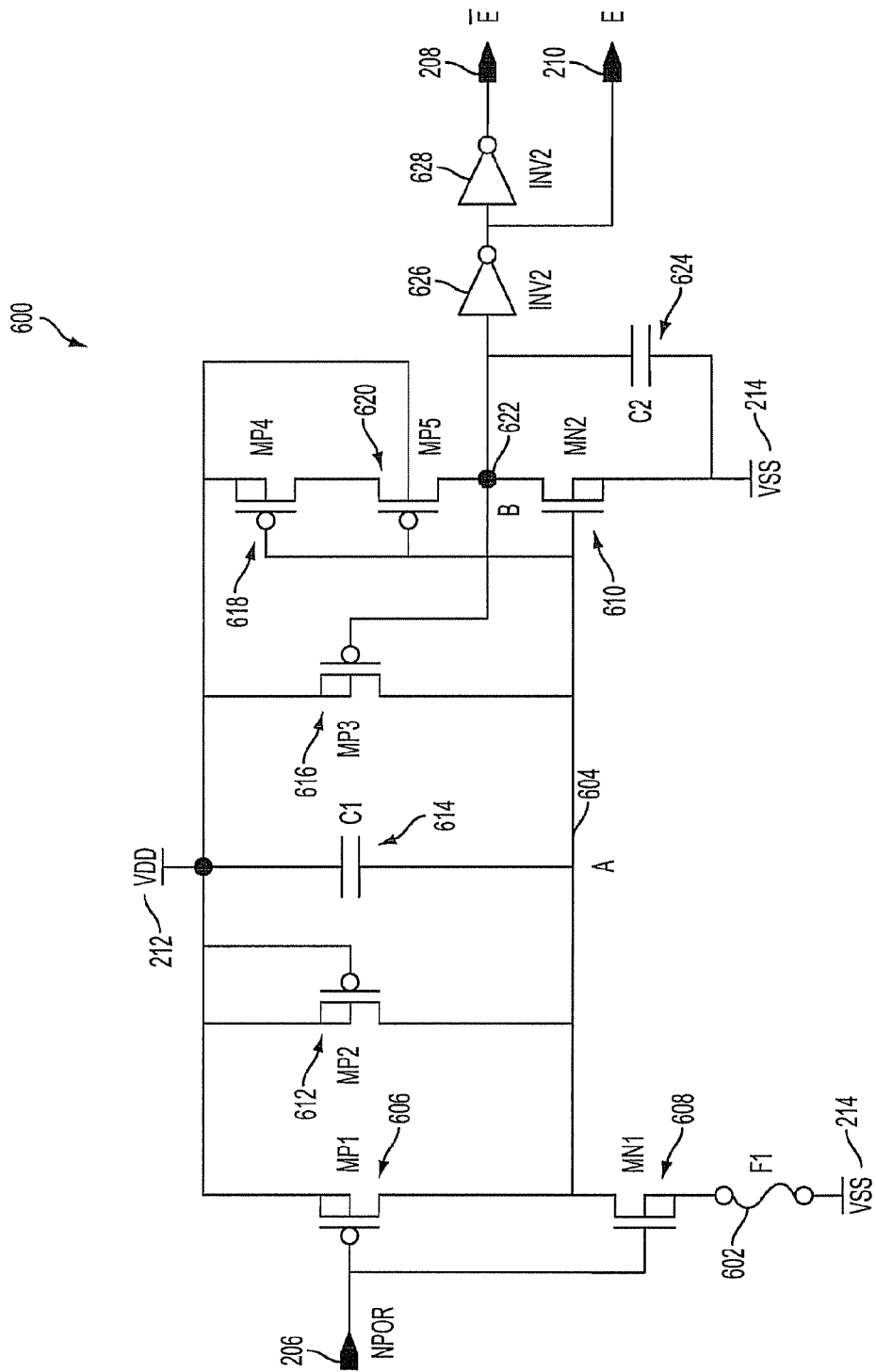
FIG. 6 is a combined schematic and circuit diagram for an example programmable switch circuit according to an embodiment of the invention.

FIG. 6 provides a combined schematic and circuit diagram for a programmable switch circuit 600 according to an embodiment of the invention. As noted above, switch circuit 600 receives reference voltages VDD 212 and VSS 214, and further receives signal NPOR 206 output by the power-on reset circuit 300. Switch circuit 600 comprises a fuse 602, the state of which directs the values of output enable signal 210 and its complement 208. Specifically, in the initial state of circuit 600 with fuse 602 unblown, the output signals 208 and 210 are independent of the input signal NPOR 206 and enable signal 210 is held low while its complement 208 is forced high. Alternatively, when fuse 602 is blown it causes the remaining logic in switch circuit 600 to evaluate such that the enable signal 210 goes high and follows VDD once the NPOR 206 signal triggers, while the enable complement signal 208 is forced low to VSS.

According to the embodiment illustrated in FIG. 6, switch circuit 600 comprises a PMOS transistor 606 that selectively couples VDD 212 to internal node A 604, and which is controlled by input signal NPOR 206. Accordingly, PMOS transistor 606 has its source connected to VDD, its gate coupled to signal NPOR 206, and its drain connected internal node A 604. An NMOS transistor 608 also has its gate coupled to signal NPOR 206 and its drain connected to internal node A 604, and has its source connected to fuse 602. Thus, NMOS transistor 608 may be used to selectively couple internal node A 604 to fuse 602. Switch circuit 600 further comprises PMOS transistors 618 and 620, where PMOS transistor 618 has its source coupled to VDD, and its drain coupled to the source of PMOS transistor 620. The drain of PMOS transistor 620 is coupled to output node B 622. Further, the gates of both PMOS transistors 618 and 620 are coupled to internal node A 604. Internal node A 604 is further coupled to the gate of a second NMOS transistor 610, which has its drain coupled to output node B 622 and its source coupled to VSS 214. Thus, PMOS transistors 618 and 620 as driven by internal node A 604 function to selectively couple VDD 212 and output node B 622.

To provide output signals 210 and 208, two inverters 626 and 628 may be connected in series to internal node B 622. The first inverter 628 receives internal node B 622 as its input, and produces the enable signal 210 as its output. The second series inverter 628 receives the output of the first inverter 626, and produces the enable complement signal 208. Both inverters 626 and 628 act as buffers between the switch circuit 600 and any circuits receiving outputs 208 and 210. Alternately, the inverter 628 could be eliminated and complement signal 208 directly connected to internal node B 622.

Switch circuit 600 further comprises a fourth PMOS transistor 616 having it source connected to VDD 212, its drain coupled to internal node A 604, and its gate coupled to output node B 622. Through PMOS transistor 616, output node B 622 affects the voltage of internal node A 604 and provides feedback in the system.

In an alternative embodiment, the two PMOS transistors 618 and 620 located in series between VDD 212 and internal node B 622 may be replaced by a single PMOS transistor. This single PMOS transistor may have its source coupled to VDD 212, its drain coupled to output node B 622, and its gate coupled to internal node A 604. Of course, more than two PMOS transistor 618 and 620 could also be provided.

The switch circuit 600 may further comprise additional or alternate devices and components in order to improve circuit performance or to provide additional stability or functionality. For example, switch circuit 600 may comprise a diode-connected PMOS transistor 612 having its source and gate connected to VDD 212, and its drain coupled to internal node A 604. In addition, the switch circuit 600 may comprise one or more capacitors, such as a first capacitor 614 having one terminal coupled to VDD 212 and its other terminal coupled to internal node A 604, or a second capacitor 624 having one plate coupled to output node B 622 and the other terminal coupled to VSS 214.

Although switch circuit 600 may contain a blown fuse 602, and may therefore be susceptible to the effects of leakage current through the blown fuse 602, these effects are significantly mitigated when input signal NPOR 206 is provided by a circuit (such as power-on reset circuit 300) that ensures a relatively quick ramp rate for the input signal after VDD 212 reaches the threshold voltage. Thus, in a system for initializing circuitry that includes power-on reset circuit 300 and switch circuit 600, the output signals are hardened against incorrect states due to varying ramp rates of the reference voltage VDD 212.

Figure 7:
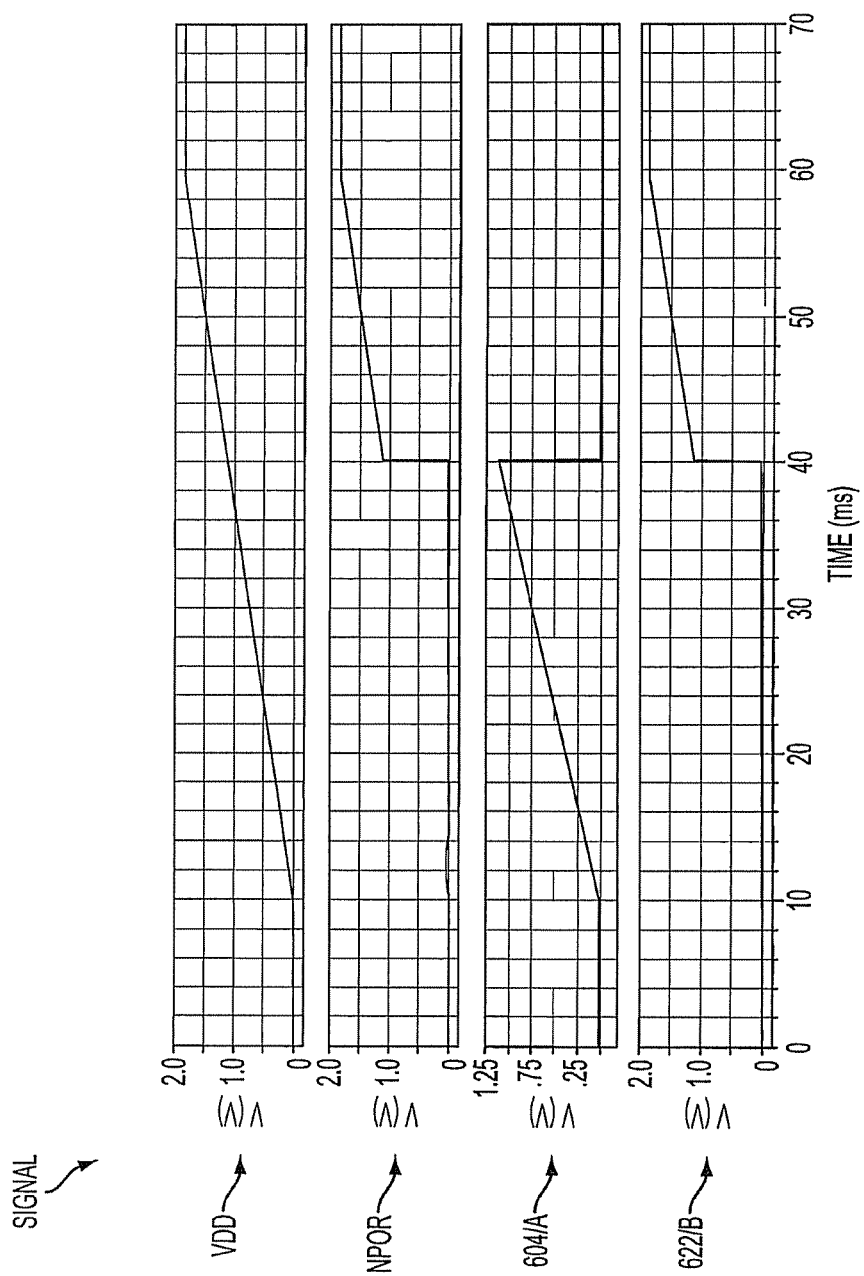
FIG. 7 is a first timing diagram explaining an operation of the circuit of FIG. 6.
Figure 8:
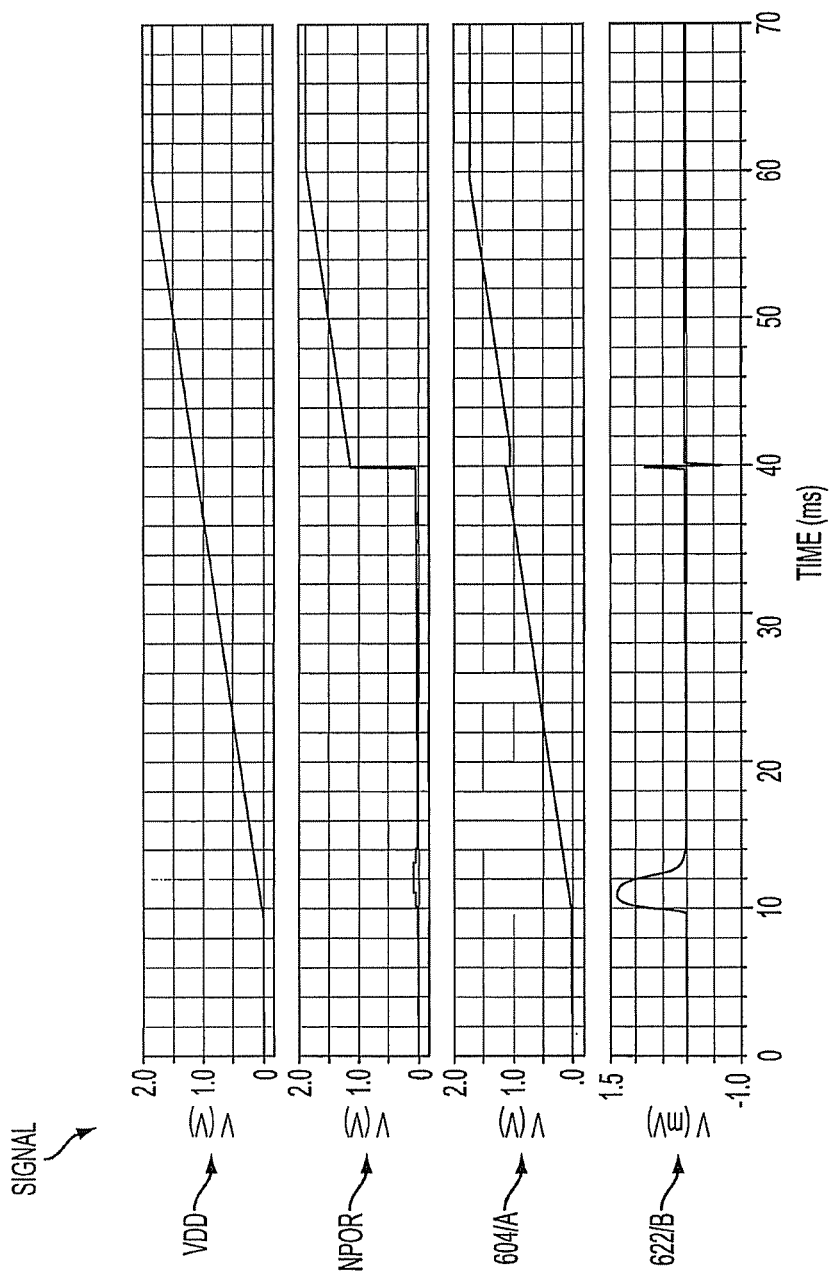
FIG. 8 is a second timing diagram explaining an operation of the circuit of FIG. 6.

FIGS. 7 and 8 set forth timing diagrams illustrating the operation of the switch circuit 600 with the fuse 602 in an unblown and a blown state, respectively. The function of the switch circuit 600 of FIG. 6 will be described along with the timing diagrams of FIGS. 7 and 8.

As noted above, the output signals 208 and 210 of switch circuit 600 are used to initialize circuitry to a correct state upon power-up. Therefore initially signal NPOR 206 is low which keeps PMOS transistor 606 on and keeps NMOS transistor 608 off. As a result, and as shown in FIGS. 7 and 8, internal node A 604 initially follows the voltage of VDD 212 and turns on NMOS transistor 610 independent of whether or not the fuse 602 is blown. With NMOS transistor 610 turned on, output node B 622 is held at VSS, thereby forcing output enable signal 210 to a high state, and its complement 208 to a low state. With node B 622 at VSS, PMOS transistor 616 provides feedback and reinforces node A 604 at VDD.

Accordingly, prior to the switching event of the input signal 206 at time=40 ms in FIGS. 7 and 8, the behavior of the switch circuit 600 is independent of the condition of the fuse 602. However, after the switching event at time=40 ms, the switch circuit 600 evaluates output signals 208 and 210 based on whether the fuse 602 is blown or un-blown.

For the initial state in which fuse 602 is un-blown, when the switching event occurs and input signal 206 rises to VDD, PMOS transistor 606 turns off and NMOS transistor 608 turns on. With fuse 602 intact, and as shown in FIG. 7, internal node A 604 discharges to VSS, thereby turning on PMOS transistors 618 and 620, pulling output node B 622 high to VDD, and cutting off the feedback signal through PMOS transistor 616. After passing through inverters 626 and 628, the signal at output node B 622 forces enable signal 210 low and the enable complement signal 208 high.

In the active (programmed) state, fuse 602 of switch circuit 600 is blown, thereby severing the direct coupling between internal node A 604 and VSS 214. Again, prior to the switching event at time=40 ms PMOS transistor 606 is on, NMOS transistor 608 is off, internal node A follows the voltage of VDD 212, internal node B 622 is held low to VSS 214, and feedback through PMOS transistor 616 reinforces the high state of internal node A 616. After the switching event occurs at time=40 ms and input signal NPOR 206 quickly ramps up to VDD, PMOS transistor 606 is turned off and NMOS transistor 608 is turned on. Although there may be some parasitic leakage through the blown fuse, the feedback signal through PMOS transistor 616 ensures that internal node A 604 stays high, which in turn maintains node B 622 at VSS 214 by keeping NMOS transistor 610 on, as shown in FIG. 8. The low state of output node B 622 at VSS forces output enable signal 210 to a high state, and its complement 208 to a low state.

Figure 9:
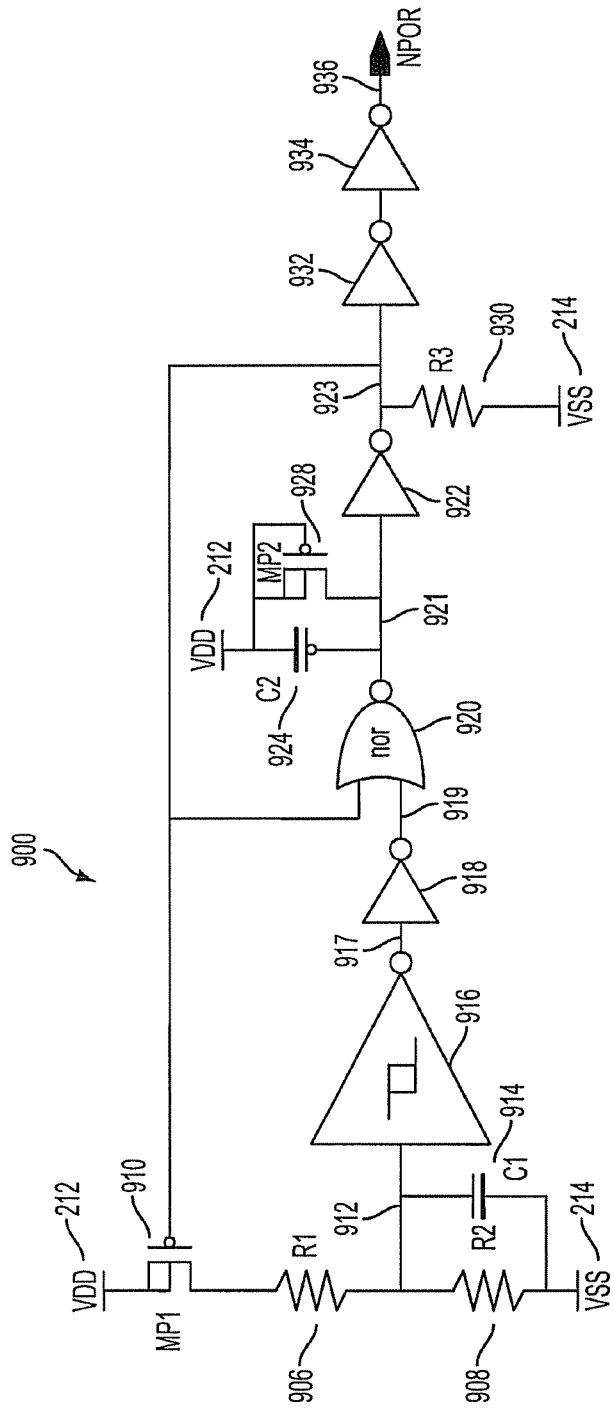
FIG. 9 is a combined schematic and circuit diagram for an alternative power-on reset circuit according to an embodiment of the invention.

FIG. 9 provides a combined schematic and circuit diagram for an alternate power-on reset circuit 900 according to an embodiment of the invention. Reference characters are made similar to those of FIG. 3 for similarly placed device elements. A brief description of the circuit layout will be provided, however, a detailed description of the layout and function of the circuit of FIG. 9 will be limited to those elements and functionality that differ from that of the circuit of FIG. 3.

Similar to the power-on reset circuit 300 of FIG. 3, power-on reset circuit 900 resets to a low value upon a reset of the circuit, or when power is no longer supplied to reference voltage VDD 212. In one embodiment, power-on reset circuit 900 comprises a NOR gate 920, and an inverter 922, where inverter 922 receives the output signal 921 of NOR gate 920. NOR gate 920 receives as its input the detection signal 919 and the output 923 of inverter 922. The detection signal 919 may be generated by Schmitt trigger 916 and inverter 918. The input to the Schmitt trigger 916 may be provided by a voltage divider circuit comprised of resistors 906 and 908 selectively coupled to VDD 212 via feedback transistor MP1 910. The output 923 of inverter 922 provides a feedback signal to the feedback transistor MP1 910, and may serve as the output NPOR signal of power-on reset circuit 900. Power-on reset circuit 900 may further comprise two inverters 932 and 934 connected in series, which may act as buffers. The output of the inverter 934 is representative of the relative voltage level (i.e. low or high) of output node 923, and may also serve as the output NPOR signal 936 of power-on reset circuit 900.

Similar to the power-on reset circuit 300 of FIG. 3, the power-on reset circuit 900 may also comprise a capacitor 914 connected in parallel with the second resistor 908 of the voltage divider circuit, and a diode-connected PMOS transistor 928 connected in parallel with a capacitor C2 924, having its source and gate connected to VDD 212, and its drain connected to the output node 921 of the NOR gate.

In contrast to the circuit of FIG. 3, the circuit of FIG. 9 replaces the diode-connected NMOS transistor 330 and capacitor 326 with a single high-resistance resistor 930 on the path from the node 323 to VSS 214. The replacement of the diode-connected transistor 330 of FIG. 3 with the high-resistance resistor 930 of FIG. 9 improves the speed at which residual charge on the node 923 can be drained to ground.

Figure 10:
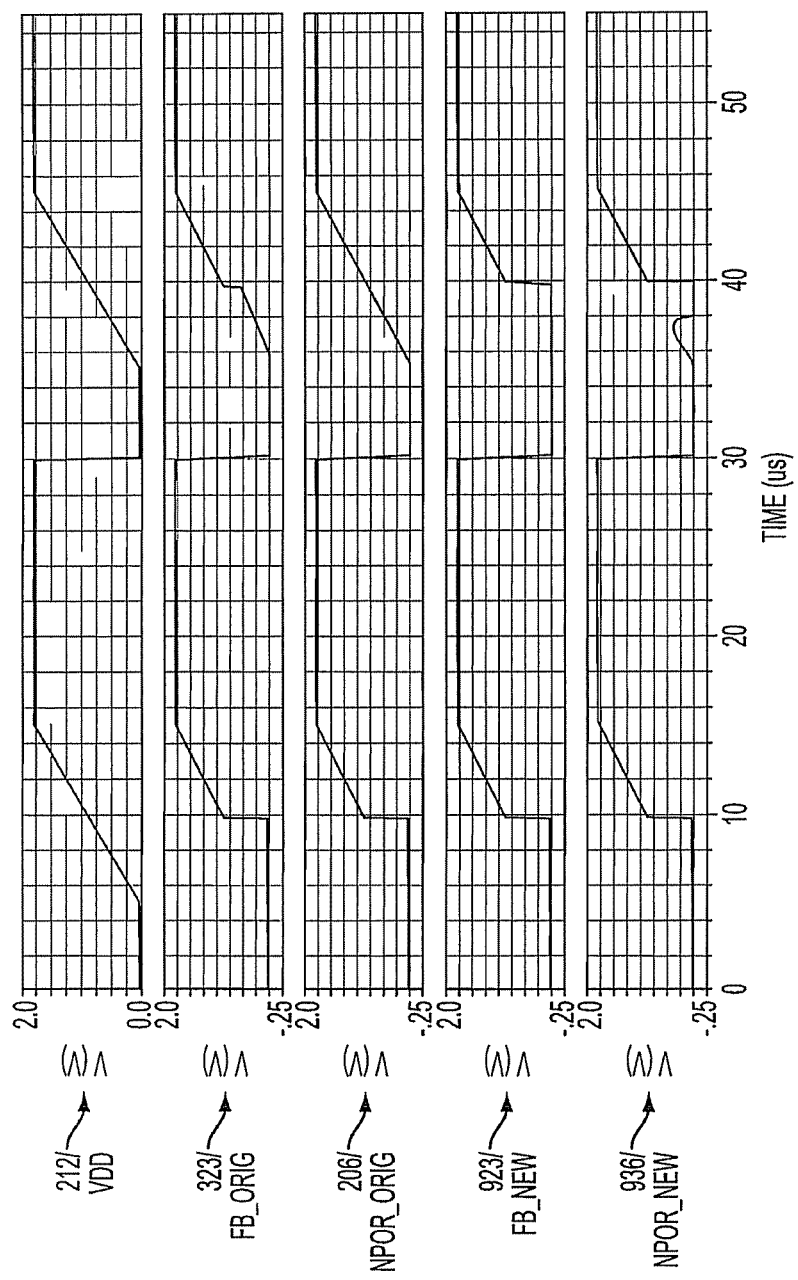
FIG. 10 is a timing diagram explaining an operation of the circuit of FIG. 9.

FIG. 10 sets forth timing diagrams for the feedback signal at node 323 of FIG. 3, the output signal NPOR 206 of FIG. 3, the feedback signal at node 923 of FIG. 9, and the output signal NPOR 936 of FIG. 9. The VDD signal wave trace of FIG. 10 shows a "fast" power cycle event in which the power signal VDD 212 is lost at approximately t=30 µs, and begins to ramp-up again at t=35 µs. Due to the quick loss and reassertion of VDD 212 in FIG. 10, the node 323 of FIG. 3 may not have sufficient time to discharge through the diode-connected transistor MN1 330 and cause transistor MP1 to turn on again. As a result, and as shown in the 206/NPOR_orig wavetrace of FIG. 10, the NPOR signal 206 follows VDD 212 instead of holding at VSS 214 until the threshold level of VDD is reached, resulting in a POR misfire.

The replacement of diode-connected transistor MN1 of FIG. 3 with the high-resistance resistor 930 of FIG. 9, and the elimination of the capacitor C3 326 of FIG. 3, may eliminate or greatly reduce the possibility of a misfire in situations involving "fast" power cycle events. The elimination of the coupling capacitor C3 326 of FIG. 3 also reduces the amount of charging capacitance on the node 923 of FIG. 9, so that only the gate capacitance of transistor MP1 910, the transistors in inverter 932, and the drain capacitance of inverter 922 would need to be discharged in the event of a loss of VDD 212, along with any parasitic capacitance in the line. The resistor 930 may be a thin film or Schottky device, and may have a resistance of 10 kΩ or greater. More preferably, the resistor 930 may have a resistance greater than 100 kΩ.

As shown in FIG. 10, the feedback signal at node 923/FB_new is held at VSS during the "fast" power cycling event until the threshold trigger voltage of VDD 212 is reached at approximately t=40 μs. As a result, the signal at node 936/NPOR_new is also held at VSS during the "fast" power cycling event until the threshold trigger voltage of VDD 212 is reached, and no misfire is produced even for a "fast" power cycle event. Accordingly, the power-on reset circuit 900 of FIG. 9 improves upon the performance of the power-on reset circuit 300 of FIG. 3 by firing even on a "fast" cycling of the input power supply VDD.

From the foregoing, it will be observed that numerous variations and modifications may be effected without departing from the spirit and scope of the invention as described above. It is to be understood that no limitation with respect to the specific methods or processes illustrated herein is intended or should be inferred. For example, where specific devices have been discussed for illustrative purposes, other devices having equivalent inputs and responses may be substituted in order to accomplish the intended functions. In addition, it is understood that various presently unforeseen or unanticipated alternatives, modifications, variations or improvements may be subsequently made by those skilled in the art, which are intended to be encompassed by the following claims and those equivalents to which they are entitled.

The invention claimed is:

1. A system for initializing redundancy circuitry on power-up comprising:
   a power-on reset circuit that receives a first reference voltage signal and outputs a power-on reset signal that indicates that the first reference voltage signal has reached a threshold voltage, the power-on reset circuit including a voltage divider circuit selectively coupled to the first reference voltage via a feedback transistor whose gate is driven by a feedback signal line;
   a switch circuit connected to the first reference voltage signal and a second reference voltage signal, the switch circuit receiving the power-on reset signal and outputting an enable signal, wherein the switch circuit further comprises a fuse and the enable signal is a first state when the fuse is blown and is a complement of the first state when the fuse is not blown; and
   a resistor that couples the feedback signal line to the second reference voltage signal,
   wherein the feedback signal line is not coupled to the second reference voltage signal with a capacitor.

2. The system of claim 1, wherein the resistor has a resistance of 10 kΩ or greater.

3. The system of claim 1 wherein the switch circuit also outputs an enable complement signal.

4. The system of claim 1 wherein the power-on reset signal is substantially equal to the second reference voltage signal prior to the threshold voltage being reached, and is substantially equal to the first reference voltage signal after the first reference voltage signal has reached the threshold voltage.

5. The system of claim 1 wherein the power-on reset circuit further comprises:
   a trigger circuit that receives the voltage divider signal and outputs a detection signal, where the detection signal indicates that the first reference voltage signal has reached the threshold voltage when the voltage divider signal exceeds a switch point voltage.

6. The system of claim 5, wherein the resistor comprises a first resistor, and wherein the voltage divider circuit comprises a second resistor and a third resistor connected in series, the second resistor connected to the first reference voltage via the feedback transistor, and the trigger circuit connected to a point between the second and third resistors.

7. The system of claim 5 wherein the trigger circuit comprises:
   a hysteresis device having a forward trigger voltage that receives the voltage divider signal and outputs a trigger signal, where the trigger signal indicates if the voltage divider signal exceeds the forward trigger voltage; and
   an inverter that receives the trigger signal and outputs the detection signal.

8. The system of claim 7 wherein the hysteresis device is a Schmitt trigger.

9. The system of claim 8 wherein the feedback transistor decouples the first reference voltage signal from the voltage divider circuit when the feedback signal line approaches the first reference voltage signal.

10. The system of claim 5 wherein the power-on reset circuit further comprises:
    a NOR device that outputs a NOR output signal;
    a first inverter that receives the NOR output signal and outputs a feedback signal on the feedback signal line; and
    wherein the NOR device receives as input the detection signal and the feedback signal.

11. The system of claim 10 wherein the power-on reset circuit further comprises:
    a diode-connected PMOS transistor connected between the first reference voltage signal and the NOR output signal.

12. The system of claim 11 wherein the power-on reset circuit further comprises a capacitor connected between the NOR output signal and the first reference voltage signal.

13. The system of claim 11 wherein the power-on reset circuit further comprises second and third inverters connected in series, where the second inverter receives the feedback signal and the third inverter outputs the power-on reset signal.

14. The system of claim 1 wherein the switch circuit further comprises:
    a first PMOS transistor that selectively couples the first reference voltage signal to an internal node and that is operated by the power-on reset signal;
    a first NMOS transistor that selectively couples the fuse to the internal node and that is operated by the power-on reset signal;
    a second NMOS transistor that selectively couples an output node to the second reference voltage signal and that is operated by the internal node;
    a second PMOS transistor that selectively couples the internal node to the first reference voltage signal and that is operated by the output node; and
    a first inverter that receives the output node and outputs the enable signal.

15. The system of claim 14 wherein the switch circuit further comprises a second inverter that receives the enable signal and outputs an enable complement signal.

16. The system of claim 15 wherein the switch circuit further comprises third and fourth PMOS transistors connected in series so as to selectively couple the first reference voltage signal to the output node, both of which are operated by the internal node.

17. The system of claim 15 wherein the switch circuit further comprises a third PMOS transistor that selectively couples the first reference voltage signal to the output node and that is operated by the internal node.

18. The system of claim 15 wherein the switch circuit further comprises a first capacitor connected between the first reference voltage signal and the internal node, and a second capacitor connected between the second reference voltage signal and the output node.

19. The system of claim 15 wherein the switch circuit further comprises a diode-connected PMOS transistor connected between the first reference voltage signal and the internal node.

20. A power-on reset circuit that receives a first reference voltage signal and a second reference voltage signal different from the first reference voltage signal, and outputs a power-on reset signal that indicates that the first reference voltage signal has reached a threshold voltage, the power-on reset circuit including a voltage divider circuit coupled to the second reference voltage signal and selectively coupled to the first reference voltage via a feedback transistor whose gate is driven by a feedback signal line,
wherein the power-on reset circuit comprises a resistor that couples the feedback signal line to the second reference voltage signal, and
wherein the feedback signal line is not coupled to the second reference voltage signal with a capacitor.

21. The circuit of claim 20, wherein the resistor has a resistance of 10 kΩ or greater.

22. The circuit of claim 21 wherein the power-on reset signal is substantially equal to the second reference voltage signal prior to the threshold voltage being reached, and is substantially equal to the first reference voltage signal after the first reference voltage signal has reached the threshold voltage.

23. The circuit of claim 21, further comprising:
a trigger circuit that receives the voltage divider signal and outputs a detection signal, where the detection signal indicates that the first reference voltage signal has reached the threshold voltage when the voltage divider signal exceeds a switch point voltage.

24. The circuit of claim 23 wherein the trigger circuit comprises:
a hysteresis device having a forward trigger voltage that receives the voltage divider signal and outputs a trigger signal, where the trigger signal indicates if the voltage divider signal exceeds the forward trigger voltage; and
an inverter that receives the trigger signal and outputs the detection signal.

25. The circuit of claim 24 wherein the hysteresis device is a Schmitt trigger.

26. The circuit of claim 23 wherein the power-on reset circuit further comprises:
a NOR device that outputs a NOR output signal;
a first inverter that receives the NOR output signal and outputs a feedback signal on the feedback signal line; and
wherein the NOR device receives as input the detection signal and the feedback signal.

27. The circuit of claim 26 wherein the power-on reset circuit further comprises:
a capacitor connected between the NOR output signal and the first reference voltage signal.

28. The circuit of claim 26 wherein the power-on reset circuit further comprises second and third series connected inverters, where the second inverter receives the feedback signal and the third inverter outputs the power-on reset signal.

29. The circuit of claim 21, wherein the resistor comprises a first resistor, and wherein the voltage divider circuit comprises a second resistor and a third resistor connected in series, the second resistor connected to the first reference voltage via the feedback transistor, and the trigger circuit connected to a point between the second and third resistors.

30. The circuit of claim 21 wherein the feedback transistor decouples the first reference voltage signal from the voltage divider circuit when the feedback signal line approaches the first reference voltage signal.

31. A method of initializing redundant circuitry comprising:
providing a power-on reset circuit for generating a power-on reset signal, the power-on reset circuit comprising a voltage divider selectively coupled to a first reference voltage via a feedback transistor having a gate controlled by a feedback signal line;
providing a resistor that couples the feedback signal line to a second reference voltage that is less than the first reference voltage, wherein the feedback signal line is not coupled to the second reference voltage with a capacitor;
providing a switch circuit comprising a fuse and which receives the generated power-on reset signal from the power-on reset circuit and generates one or more output enable signals;
receiving a first reference voltage and a second reference voltage at the power-on reset circuit;
comparing the first reference voltage to a threshold voltage at the power-on reset circuit;
maintaining, with the power-on reset circuit, the power-on reset signal at the second reference voltage when the first reference voltage is below the threshold voltage;
raising, with the power-on reset circuit, the power-on reset signal to the first reference voltage when the first reference voltage exceeds the threshold voltage; and
generating, with the switch circuit, the one or more output enable signals responsive to the power-on reset signal being raised to the first reference voltage.

32. The method of claim 31 further comprising:
selectively programming the switch circuit by blowing the fuse,
wherein a state of the one or more output enable signals depends on whether the fuse has been blown.

* * * * *